(12) United States Patent
Hong et al.

(10) Patent No.: US 12,210,065 B2
(45) Date of Patent: Jan. 28, 2025

(54) BATTERY DIAGNOSING APPARATUS AND METHOD

(71) Applicant: LG ENERGY SOLUTION, LTD., Seoul (KR)

(72) Inventors: Sung-Ju Hong, Daejeon (KR); Dong-Chun Lee, Daejeon (KR); Geon Choi, Daejeon (KR); Seog-Jin Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/926,520

(22) PCT Filed: Nov. 3, 2021

(86) PCT No.: PCT/KR2021/015825
§ 371 (c)(1),
(2) Date: Nov. 18, 2022

(87) PCT Pub. No.: WO2022/098096
PCT Pub. Date: May 12, 2022

(65) Prior Publication Data
US 2023/0194618 A1    Jun. 22, 2023

(30) Foreign Application Priority Data

Nov. 5, 2020 (KR) .......... 10-2020-0146828

(51) Int. Cl.
*G01R 31/389* (2019.01)
*G01R 31/396* (2019.01)
(52) U.S. Cl.
CPC ......... *G01R 31/389* (2019.01); *G01R 31/396* (2019.01)

(58) Field of Classification Search
CPC ........ B60W 50/0205; B60W 2510/242; G01R 31/1227; G01R 31/389; G01R 31/396;
(Continued)

(56) References Cited

U.S. PATENT DOCUMENTS 10,746,804 B2    8/2020 Park
2017/0030976 A1*  2/2017 Suzuki ................. G01R 31/389
(Continued)

FOREIGN PATENT DOCUMENTS

CN    106356554 B    4/2019
CN    106654403 B    6/2019
(Continued)

OTHER PUBLICATIONS

MIT News, David Chandler, Explained: Sigma, Feb. 9, 2012 (Year: 2012).*

(Continued)

*Primary Examiner* — Alexander Satanovsky
*Assistant Examiner* — Trung Q Nguyen
(74) *Attorney, Agent, or Firm* — Birch, Stewart, Kolasch & Birch, LLP

(57) ABSTRACT

Discussed is a battery diagnosing apparatus that can include a resistance measuring unit configured to measure an internal resistance of each of a plurality of battery modules including one or more battery cells, and a control unit configured to receive resistance information about the internal resistance of each of the plurality of battery modules from the resistance measuring unit, calculate a first criterion resistance and an absolute deviation between the first criterion resistance and the internal resistance, convert the calculated absolute deviation into a resistance deviation for the plurality of battery modules based on the resistance information, set a first resistance section based on the calculated first criterion resistance and the calculated resistance devia- (Continued)

tion, select a part of the plurality of battery modules as a target module based on the resistance information, and calculate a second criterion resistance for the target module based on the resistance information.

20 Claims, 3 Drawing Sheets

(58) Field of Classification Search
CPC .............. H01M 10/48; H01M 16/006; H01M 8/04671; H01M 2220/20; H01M 2250/20
USPC .............. 324/500, 551, 425–434, 600, 76.11
See application file for complete search history.

(56) References Cited

U.S. PATENT DOCUMENTS

| | | | |
|---|---|---|---|
| 2018/0062211 A1* | 3/2018 | Kellermann | B60L 3/12 |
| 2018/0316200 A1 | 11/2018 | Yen | |
| 2019/0018070 A1 | 1/2019 | Yamada | |
| 2019/0077265 A1 | 3/2019 | Ono et al. | |
| 2019/0081369 A1 | 3/2019 | Monden et al. | |
| 2019/0198945 A1 | 6/2019 | Machida et al. | |
| 2019/0271745 A1* | 9/2019 | Sun | G01R 31/36 |
| 2020/0319259 A1* | 10/2020 | Pressman | G05B 19/042 |
| 2021/0328272 A1* | 10/2021 | Von Emden | H01M 10/443 |
| 2023/0176139 A1* | 6/2023 | Shen | H01M 10/482 702/63 |

FOREIGN PATENT DOCUMENTS

| | | |
|---|---|---|
| DE | 11 2017 001 402 T5 | 12/2018 |
| JP | 2005-195604 A | 7/2005 |
| JP | 2012-47521 A | 3/2012 |
| JP | 2017-146194 A | 8/2017 |
| JP | 2019-113455 A | 7/2019 |
| JP | 6751915 B2 | 9/2020 |
| KR | 10-2013-0013101 A | 2/2013 |
| KR | 10-2018-0122378 A | 11/2018 |
| KR | 10-2019-0024391 A | 3/2019 |
| KR | 10-2049148 B1 | 11/2019 |

OTHER PUBLICATIONS

International Search Report for PCT/KR2021/015825 (PCT/ISA/210) mailed on Feb. 25, 2022.
Extended European Search Report for European Application No. 21889561.3, dated Jan. 5, 2024.

* cited by examiner

BATTERY DIAGNOSING APPARATUS AND METHOD

TECHNICAL FIELD

The present application claims priority to Korean Patent Application No. 10-2020-0146828 filed on Nov. 5, 2020 in the Republic of Korea, the disclosures of which are incorporated herein by reference.

The present disclosure relates to a battery diagnosing apparatus and method, and more particularly, to a battery diagnosing apparatus and method capable of diagnosing a state of each battery module based on resistances of a plurality of battery modules.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Since the battery cell has a limited capacity, a battery module in which a plurality of battery cells are connected in series and/or in parallel is mainly used. However, if the number of battery cells included in the battery module increases, an abnormal situation may occur with respect to the battery cells due to a problem in the battery cell itself and/or a connection problem between the battery cells.

For example, the connection between the plurality of battery cells may be released, non-uniform degradation may be caused due to accumulation of thermal imbalance according to installation positions of the battery cells, and/or a current concentration phenomenon may occur due to non-uniform degradation.

Therefore, it is required to develop a technology for accurately and quickly diagnosing a state of a battery module and a plurality of battery cells included in the battery module.

DISCLOSURE

Technical Problem

The present disclosure is designed to solve the problems of the related art, and therefore the present disclosure is directed to providing a battery diagnosing apparatus and method capable of more accurately diagnosing a state of a battery module.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure may include a resistance measuring unit configured to measure an internal resistance of each of a plurality of battery modules including one or more battery cells; and a control unit configured to receive resistance information about the internal resistance of each of the plurality of battery modules from the resistance measuring unit, calculate a first criterion resistance and a resistance deviation for the plurality of battery modules based on the resistance information, set a first resistance section based on the calculated first criterion resistance and the calculated resistance deviation, select a part of the plurality of battery modules as a target module based on the resistance information, calculate a second criterion resistance for the target module based on the resistance information, set a second resistance section based on the calculated second criterion resistance and a connection structure between the one or more battery cells included in each of the plurality of battery modules, and diagnose a state of each of the plurality of battery modules based on the measured internal resistance, the first resistance section and the second resistance section.

The control unit may be configured to diagnose a state of a battery module of which the calculated internal resistance belongs to both the first resistance section and the second resistance section as a normal state among the plurality of battery modules.

The control unit may be configured to diagnose a state of a battery module of which the calculated internal resistance does not belong to the first resistance section or the second resistance section as an abnormal state among the plurality of battery modules.

The control unit may be configured to calculate the first criterion resistance based on internal resistances of the plurality of battery modules, and calculate the resistance deviation based on a difference between the calculated first criterion resistance and the internal resistance of each of the plurality of battery modules.

The control unit may be configured to calculate a first lower limit value by subtracting the resistance deviation from the first criterion resistance, calculate a first upper limit value by adding the resistance deviation to the first criterion resistance, and set the first resistance section based on the calculated first lower limit value and the calculated first upper limit value.

The control unit may be configured to calculate an absolute deviation between the calculated first criterion resistance and the internal resistance of each of the plurality of battery modules, and convert the calculated absolute deviation into the resistance deviation by using a predetermined scale factor.

The first criterion resistance may be a median value for the internal resistances of the plurality of battery modules.

The control unit may be configured to select a battery module of which the calculated internal resistance is equal to or less than the first criterion resistance as the target module among the plurality of battery modules.

The control unit may be configured to calculate a parallel deviation based on a number of parallel connections of the one or more battery cells included in each of the plurality of battery modules, and set the second resistance section according to the second criterion resistance and the calculated parallel deviation.

The control unit may be configured to calculate a second lower limit value by subtracting the parallel deviation from the second criterion resistance, calculate a second upper limit value by adding the parallel deviation to the second criterion resistance, and set the second resistance section based on the calculated second lower limit value and the calculated second upper limit value.

The control unit may be configured to calculate a parallel coefficient for the plurality of battery modules based on the number of parallel connections, and calculate the parallel deviation by multiplying the calculated parallel coefficient by the second criterion resistance.

The second criterion resistance may be an average value for an internal resistance of the target module.

A battery pack according to another aspect of the present disclosure may include the battery diagnosing apparatus according to one aspect of the present disclosure.

A battery diagnosing method according to still another aspect of the present disclosure may include a resistance measuring operation of measuring an internal resistance of each of a plurality of battery modules including one or more battery cells; a first criterion resistance and resistance deviation calculating operation of calculating a first criterion resistance and a resistance deviation for the plurality of battery modules based on resistance information about the internal resistance of each of the plurality of battery modules measured in the resistance measuring operation; a first resistance section setting operation of setting a first resistance section based on the first criterion resistance and the resistance deviation calculated in the first criterion resistance and resistance deviation calculating operation; a target module selecting operation of selecting a part of the plurality of battery modules as a target module based on the resistance information; a second criterion resistance calculating operation of calculating a second criterion resistance for the target module based on the resistance information; a second resistance section setting operation of setting a second resistance section based on the second criterion resistance calculated in the second criterion resistance calculating operation and a connection structure between the one or more battery cells included in each of the plurality of battery modules; and a state diagnosing operation of diagnosing a state of each of the plurality of battery modules based on the measured internal resistance, the first resistance section and the second resistance section.

Advantageous Effects

According to one aspect of the present disclosure, since the state of the battery module is diagnosed according to whether the measured internal resistance belongs to the first resistance section and the second resistance section, the state of the battery module may be diagnosed with a stricter standard. Accordingly, the diagnosis accuracy for the state of the battery diagnosed by the battery diagnosing apparatus may be improved.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, terms such as a control unit described in the specification mean a unit that processes at least one function or operation, which may be implemented as hardware or software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
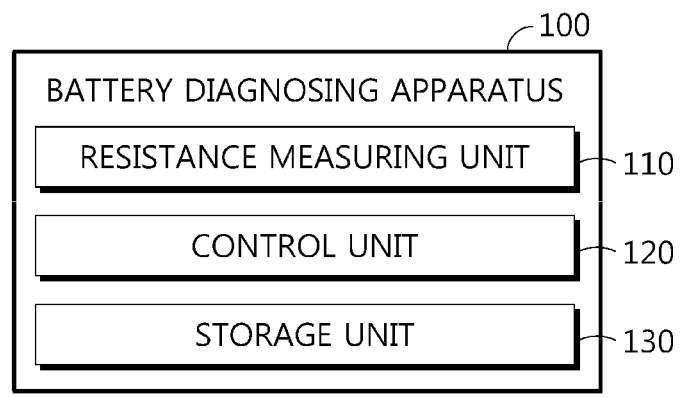
FIG. 1 is a diagram schematically showing a battery diagnosing apparatus according to an embodiment of the present disclosure.

FIG. 1 is a diagram schematically showing a battery diagnosing apparatus 100 according to an embodiment of the present disclosure.

Referring to FIG. 1, the battery diagnosing apparatus 100 according to an embodiment of the present disclosure may include a resistance measuring unit 110 and a control unit 120.

The resistance measuring unit 110 may be configured to measure an internal resistance of each of a plurality of battery modules including one or more battery cells.

Here, the battery module may include one or more battery cells connected in series and/or in parallel. In addition, the battery cell means a physically separable one independent cell having a negative electrode terminal and a positive electrode terminal. For example, one pouch-type lithium polymer cell may be regarded as a battery cell.

The resistance measuring unit 110 may measure the resistance of the battery module when charging is started or when discharging is terminated. Preferably, the resistance measuring unit 110 may be configured to measure a voltage of the battery module.

Specifically, the resistance measuring unit 110 may measure the voltage of the battery module at a first time point when charging of the battery module starts, and may measure the voltage of the battery module at a second time point when a predetermined time elapses from the first time point. In addition, the resistance measuring unit 110 may calculate a voltage difference between the voltages of the battery module measured at the first time point and the second time point, respectively. In addition, the resistance measuring unit 110 may calculate the internal resistance of the battery module by using the calculated voltage difference and a charging current for the battery module. Here, the magnitude of the charging current (or discharging current) may be a preset value or a value directly measured by the resistance measuring unit 110. In addition, the resistance measuring unit 110 may receive the magnitude of the charging current (or discharging current) from the outside.

For example, the resistance measuring unit 110 may measure a first voltage of the battery module at the first time point, and measure a second voltage of the battery module at the second time point when 5 seconds have elapsed from the first time point. In addition, the resistance measuring unit 110 may measure the resistance of the battery module based on the difference between the second voltage and the first voltage.

Hereinafter, it is assumed that the battery module may be charged and/or discharged with a constant current.

In this case, the resistance measuring unit 110 may measure the resistance of the battery module through Equation 1 below.

$$DCIR_i = \frac{\Delta V_i}{I} \quad \text{[Equation 1]}$$

Here, DCIR is the resistance [Ω] of the battery module, and I is the charging current [mA] or discharging current [mA] for the battery module. ΔV is the voltage difference [mV] of the battery module for a predetermined time. i is an index indicating each battery module, and may be 1 or more and n or less. n may be the total number of the plurality of battery modules whose state is to be diagnosed by the battery diagnosing apparatus 100.

For example, the resistance measuring unit 110 may measure the first voltage ($V_1$) of the battery module at the first time point when charging starts. In addition, the resistance measuring unit 110 may measure the second voltage ($V_2$) of the battery module at the second time point at which a predetermined time has elapsed from the first time point. The resistance measuring unit 110 calculates "$V_2-V_1$" to calculate the voltage difference of the battery module between the first time point and the second time point. In this case, since the magnitude of the charging current (I) for the battery module is constant, the resistance measuring unit 110 may measure the resistance (DCIR) of the battery module based on the voltage difference (ΔV) and the current (I).

The control unit 120 may be configured to receive resistance information about the internal resistance of each of the plurality of battery modules from the resistance measuring unit 110.

The control unit 120 and the resistance measuring unit 110 may be connected to be able to communicate with each other. The resistance measuring unit 110 may measure the internal resistance of each of the plurality of battery modules and transmit resistance information about the measured internal resistance to the control unit 120.

The control unit 120 may be configured to calculate a first criterion resistance R1 and a resistance deviation for the plurality of battery modules based on the resistance information.

The first criterion resistance R1 is a value calculated by considering all of the internal resistances of the plurality of battery modules, and may be a value representing the internal resistances of the plurality of battery modules. In addition, the resistance deviation may be a value calculated based on the internal resistance of each of the plurality of battery modules and the first criterion resistance R1.

For example, the first criterion resistance R1 is a value representing the internal resistances of the plurality of battery modules, and a median value or an average value may be applied. Preferably, the first criterion resistance R1 may be a median value of the internal resistances of the plurality of battery modules.

The control unit 120 may be configured to set a first resistance section based on the calculated first criterion resistance R1 and the calculated resistance deviation.

Figure 2:
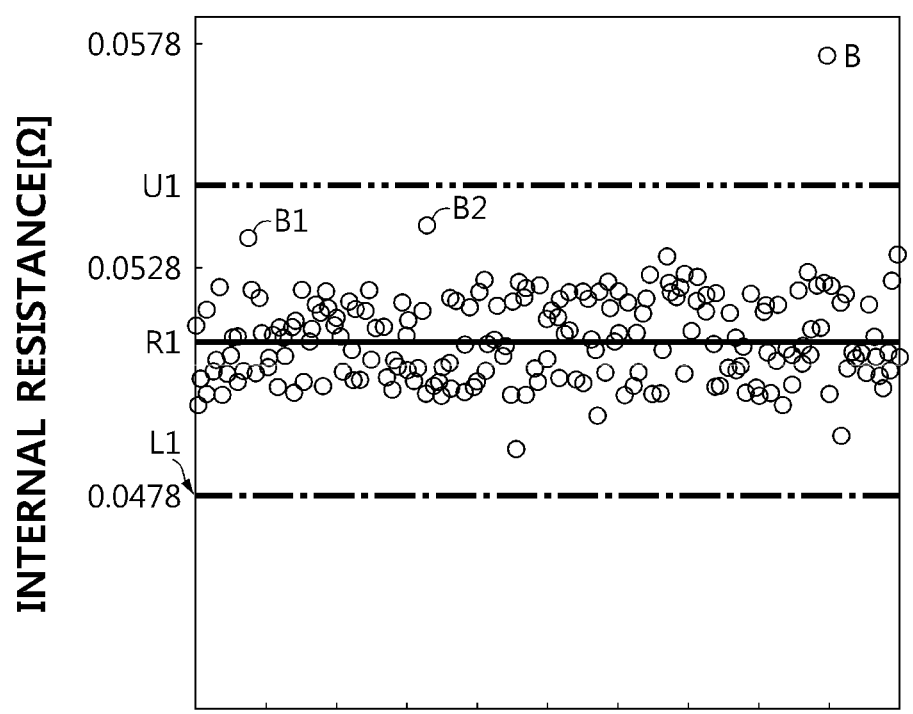
FIG. 2 is a diagram schematically showing a first resistance section according to an embodiment of the present disclosure.

FIG. 2 is a diagram schematically showing the first resistance section according to an embodiment of the present disclosure. Specifically, FIG. 2 is a diagram showing the internal resistances of the plurality of battery modules B in the form of a graph, and includes a first criterion resistance R1, a first upper limit value U1, and a first lower limit value L1. In FIG. 2, the Y-axis may represent the internal resistance [Ω], and the X-axis may be a serial number of the battery module B. That is, the value of the X-axis is a value independent of the internal resistance, and may be applied without limitation as long as it is a factor that can identify each of the plurality of battery modules B.

Referring to FIG. 2, the first lower limit value L1 and the first upper limit value U1 may be set symmetrically with respect to the first criterion resistance R1. The resistance section from the first lower limit value L1 to the first upper limit value U1 may be set as the first resistance section. In addition, in the embodiment of FIG. 2, all of the internal resistances of the plurality of battery modules B may be included in the first resistance section.

The control unit 120 may be configured to select a part of the plurality of battery modules B as a target module based on the resistance information.

For example, the control unit 120 may select two or more battery modules B among the plurality of battery modules B as a target module. Preferably, the control unit 120 may be configured to select a battery module B of which the calculated internal resistance is equal to or less than the first criterion resistance R1 as the target module among the plurality of battery modules B.

The first criterion resistance R1 may employ a median value or an average value of the plurality of battery modules B. If the first criterion resistance R1 is an average value of the internal resistances of the plurality of battery modules B, a battery module B of which the internal resistance is equal to or less than the average may be selected as the target module. Conversely, if the first criterion resistance R1 is a median value of the internal resistances of the plurality of battery modules B, a battery module B of which the internal resistance belongs to lower 50% may be selected as the target module.

The control unit 120 may be configured to calculate a second criterion resistance R2 for the target module based on the resistance information.

The second criterion resistance R2 is a value calculated by considering all the internal resistances of the plurality of target modules selected by the control unit 120, and may be a value representing the internal resistances of the plurality of target modules. That is, the second criterion resistance R2 may be a resistance value representing the internal resistances of the plurality of target modules, and the first criterion resistance R1 may be a resistance value representing the internal resistances of the plurality of battery modules B.

For example, the second criterion resistance R2 is a value representing the internal resistances of the plurality of target modules, and a median value or an average value may be applied. Preferably, the second criterion resistance R2 may be an average value of the internal resistances of a plurality of target modules.

The control unit 120 may be configured to set a second resistance section based on the calculated second criterion resistance R2 and a connection structure between the battery cells included in each of the plurality of battery modules B.

Here, the connection structure between the battery cells means a series or parallel structure in which the plurality of battery cells included in each battery module B are connected to each other. In addition, the connection structure between the battery cells considered by the control unit 120 may be the number of parallel connection structures formed for the plurality of battery cells.

For example, it is assumed that a total of 16 battery cells are included in the battery module B, 8 battery cells are connected in series to form two unit modules, and the two unit modules are connected in parallel with each other. In this case, the control unit 120 may determine that the number of parallel connection structures between the plurality of battery cells included in the battery module B is two. Preferably, the plurality of battery modules B may be modules having the same connection structure of the included plurality of battery cells. That is, in the previous embodiment, all of the plurality of battery modules B may include 16 battery cells, the 16 battery cells may be connected in series by 8 battery cells to form two unit modules, and the formed two unit modules may be connected in parallel to each other.

Figure 3:
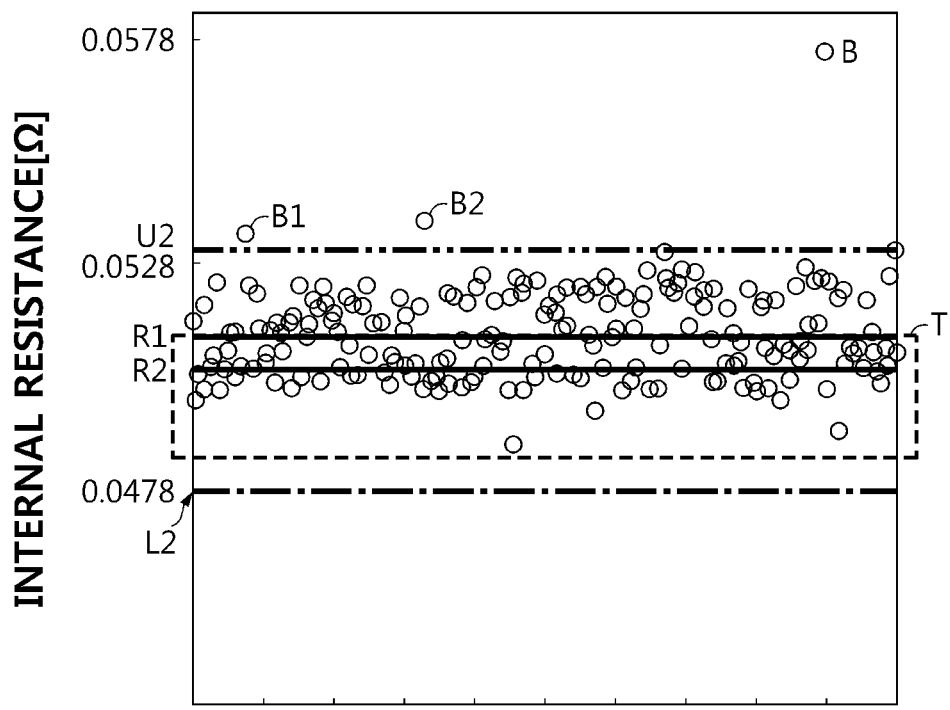
FIG. 3 is a diagram schematically showing a second resistance section according to an embodiment of the present disclosure.

FIG. 3 is a diagram schematically showing the second resistance section according to an embodiment of the present disclosure. Specifically, FIG. 3 is a diagram showing the internal resistances of the plurality of battery modules B in the form of a graph, and includes a second criterion resistance R2, a second upper limit value U2, and a second lower limit value L2. Similar to FIG. 2, in FIG. 3, the Y-axis represents the internal resistance [Ω], and the X-axis may be a serial number of the battery module B. That is, the value of the X-axis is a value independent of the internal resistance, and may be applied without limitation as long as it is a factor that can identify each of the plurality of battery modules B. Specifically, in the embodiments of FIGS. 2 and 3, the plurality of battery modules B depicted may be the same.

Referring to FIG. 3, the second lower limit value L2 and the second upper limit value U2 may be set symmetrically with respect to the second criterion resistance R2. A resistance section from the second lower limit value L2 to the second upper limit value U2 may be set as the second resistance section. In addition, in the embodiment of FIG. 3, all of the internal resistances of the plurality of battery modules B may be included in the first resistance section.

The control unit 120 may be configured to diagnose the state of each of the plurality of battery modules B based on the measured internal resistance, the first resistance section and the second resistance section.

The control unit 120 may diagnose the state of the plurality of battery modules B by considering both the first resistance section and the second resistance section, instead of considering only one of the first resistance section and the second resistance section.

Preferably, the control unit 120 may be configured to diagnose the state of a battery module B of which the calculated internal resistance belongs to both the first resistance section and the second resistance section as a normal state, among the plurality of battery modules B. Conversely, the control unit 120 may be configured to diagnose the state of a battery module B of which the calculated internal resistance does not belong to the first resistance section or the second resistance section as an abnormal state, among the plurality of battery modules B.

For example, referring to the embodiment of FIG. 2, the measured internal resistances of the first battery module B1 and the second battery module B2 among the plurality of battery modules B may be included in the first resistance section. That is, the measured internal resistances of the first battery module B1 and the second battery module B2 may be greater than the first criterion resistance R1, but may be less than the first upper limit value U1.

However, referring to the embodiment of FIG. 3, the measured internal resistances of the first battery module B1 and the second battery module B2 among the plurality of battery modules B may not be included in the second resistance section. That is, the measured internal resistances of the first battery module B1 and the second battery module B2 may be greater than the second criterion resistance R2 and greater than the second upper limit value U2.

Accordingly, the control unit 120 may diagnose the states of the first battery module B1 and the second battery module B2 as an abnormal state.

That is, the first resistance section may be a resistance section set for the plurality of battery modules B, but the second resistance section may be a resistance section set for the plurality of target modules T. Accordingly, the first resistance section and the second resistance section may be different from each other. Since the battery diagnosing apparatus 100 diagnoses the state of the battery module B according to whether the measured internal resistance belongs to the first resistance section and the second resistance section, it is possible to diagnose the state of the battery module B with a stricter standard. In addition, since the battery diagnosing apparatus 100 diagnoses the state of the battery module B based on two independent resistance sections, there is an advantage in that the diagnosis accuracy for the state of the battery diagnosed by the battery diagnosing apparatus 100 may be improved.

In addition, the battery diagnosing apparatus 100 may store the information about the battery module B diagnosed as an abnormal state or output the information to the outside. Accordingly, the battery module B diagnosed as an abnormal state may be replaced and/or inspected precisely. That is, accidents such as explosions and fires that may occur due to continuous use of the battery module B in an abnormal state may be prevented in advance.

Meanwhile, the control unit 120 provided to the battery diagnosing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 120 may be implemented as a set of program modules. At this time, the program module may be stored in a memory and executed by the control unit 120. The memory may be provided in or out of the control unit 120, and may be connected to the control unit 120 by various well-known means.

In addition, the battery diagnosing apparatus 100 may further include a storage unit 130. The storage unit 130 may store data or programs necessary for operation and function of each component of the battery diagnosing apparatus 100, data generated in the process of performing the operation or function, or the like. The storage unit 130 is not particularly limited in its kind as long as it is a known information storage means that can record, erase, update and read data. As an example, the information storage means may include RAM, flash memory, ROM, EEPROM, registers, and the like. In addition, the storage unit 130 may store program codes in which processes executable by the control unit 120 are defined.

For example, the storage unit 130 may store the resistance information of the plurality of battery modules B measured by the resistance measuring unit 110. The control unit 120 may directly receive the resistance information from the resistance measuring unit 110 or access the storage unit 130 to acquire the stored resistance information.

Hereinafter, the content of the control unit 120 setting the first resistance section will be described in detail.

The control unit 120 may be configured to calculate the first criterion resistance R1 based on the internal resistances of the plurality of battery modules B.

For example, the control unit 120 may calculate a median value for the internal resistances of the plurality of battery modules B measured by the resistance measuring unit 110. In addition, the control unit 120 may set the calculated median value as the first criterion resistance R1 for the plurality of battery modules B. That is, when the internal resistances of the plurality of battery modules B is arranged in order of magnitude, the control unit 120 may set a value located at the central as the first criterion resistance R1.

The control unit 120 may be configured to calculate the resistance deviation according to a difference between the calculated first criterion resistance R1 and the internal resistance of each of the plurality of battery modules B.

Specifically, the control unit 120 may calculate an absolute deviation between the calculated first criterion resistance R1 and the internal resistance of each of the plurality of battery modules B. More specifically, the control unit 120 may calculate a median absolute deviation (MAD) between the first criterion resistance R1 and the internal resistance of each of the plurality of battery modules.

For example, the control unit 120 may calculate the median absolute deviation between the first criterion resistance R1 and the internal resistance of each of the plurality of battery modules B using Equation 2 below.

$$D = \text{median}(|DCIR_i - R1|), (1 \le i \le n) \quad \text{[Equation 2]}$$

Here, i is an index indicating each battery module B, and may be 1 or more and n or less. n may be the total number of the plurality of battery modules B whose state is to be diagnosed by the battery diagnosing apparatus 100. R1 is the first criterion resistance, and DCIR is the internal resistance of the battery module B. median ( ) is a function that outputs a median value for $|DCIR_i - R1|$, and D may be a median absolute deviation (hereinafter, described as absolute deviation). That is, D may be the absolute deviation between the first criterion resistance R1 and the internal resistance ($DCIR_i$) of the plurality of battery modules B.

After calculating the absolute deviation (Di) for each of the plurality of battery modules B, the control unit 120 may convert the calculated absolute deviation (Di) into a resistance deviation (S).

Specifically, the control unit 120 may be configured to convert the calculated absolute deviation into the resistance deviation by using a predetermined scale factor.

For example, the control unit 120 may calculate the scale factor using Equation 3 below.

$$C = -\frac{1}{\sqrt{2} \times \text{erfcinv}(a)} \quad \text{[Equation 3]}$$

Here, C is the scale factor, erfcinv(a) is an inverse complementary error function, and a is a constant. For example, when a is 3/2, erfcinv(3/2) may be an output value of an inverse complementary error function with respect to the input value of 3/2.

The control unit 120 may convert the absolute deviation into a resistance deviation by using Equation 4 below.

$$S = D \times C \quad \text{[Equation 4]}$$

Here, S is the converted resistance deviation, D is the absolute deviation for the first criterion resistance R1 and the internal resistance of the plurality of battery modules B according to Equation 2, and C is the scale factor according to Equation 3.

The control unit 120 may calculate the first lower limit value L1 by subtracting the resistance deviation from the first criterion resistance R1.

For example, the control unit 120 may calculate the first lower limit value L1 by subtracting the resistance deviation from the first criterion resistance R1. Specifically, in the embodiment of FIG. 2, the control unit 120 may calculate the first lower limit value L1 by subtracting the resistance deviation S according to Equation 4 from the first criterion resistance R1. That is, the control unit 120 may calculate "R1−S" to calculate the first lower limit value L1.

In addition, the control unit 120 may be configured to calculate the first upper limit value U1 by adding the resistance deviation to the first criterion resistance R1.

For example, the control unit 120 may calculate the first upper limit value U1 by adding the resistance deviation to the first criterion resistance R1. Specifically, in the embodiment of FIG. 2, the control unit 120 may calculate the first upper limit value U1 by adding the resistance deviation S according to Equation 4 to the first criterion resistance R1. That is, the control unit 120 may calculate "R1+S" to calculate the first upper limit value U1.

Finally, the control unit 120 may be configured to set the first resistance section based on the calculated first lower limit value L1 and the calculated first upper limit value U1.

For example, the control unit 120 may set the calculated first lower limit value L1 as the lower limit threshold value of the first resistance section, and set the calculated first upper limit value U1 as the upper limit threshold value of the first resistance section. That is, the control unit 120 may set the resistance section corresponding to "R1−S to R1+S" as the first resistance section.

Hereinafter, the content of the control unit 120 setting the second resistance section will be described in detail.

The control unit 120 may be configured to calculate a parallel deviation based on the number of parallel connections of the battery cells included in each of the plurality of battery modules B.

Here, the parallel deviation may be the number of parallel connections of the plurality of battery cells included in the battery module B. For example, it is assumed that 16 battery cells are included in the battery module B, 8 battery cells are connected in series to form two unit modules, and two unit modules are connected in parallel with each other. In this case, the number of parallel connections for the battery module B calculated by the control unit 120 may be 2.

Thereafter, the control unit 120 may calculate a parallel coefficient from the number of parallel connections, and calculate a parallel deviation based on the calculated parallel coefficient and the second criterion resistance R2.

Specifically, the control unit 120 may be configured to calculate the parallel coefficient for the plurality of battery modules B based on the number of parallel connections.

Here, the parallel coefficient is a value related to the number of parallel connections of the plurality of battery cells included in the battery module B, and may be calculated according to Equation 5 below.

$$\mu = \frac{1}{m-b} \quad \text{[Equation 5]}$$

Here, μ is the parallel coefficient, and m is the number of parallel connections. b is a constant, and for example, may be 0 or 1. That is, the parallel coefficient (μ) may be related to the reciprocal of the number of parallel connections (m).

In addition, the control unit 120 may be configured to calculate the parallel deviation by multiplying the calculated parallel coefficient by the second criterion resistance R2. For example, the control unit 120 may calculate the parallel deviation according to Equation 6 below.

$$P = R2 \times \mu \quad \text{[Equation 6]}$$

Here, P is the parallel deviation, R2 is the second criterion resistance, and μ is the parallel coefficient according to Equation 5.

The control unit 120 may be configured to set the second resistance section according to the second criterion resistance R2 and the calculated parallel deviation.

The control unit 120 may be configured to calculate the second lower limit value L2 by subtracting the parallel deviation from the second criterion resistance R2.

For example, the control unit 120 may calculate the second lower limit value L2 by subtracting the parallel deviation from the second criterion resistance R2. Specifically, in the embodiment of FIG. 3, the control unit 120 may calculate the second lower limit value L2 by subtracting the parallel deviation P according to Equation 6 from the second criterion resistance R2. That is, the control unit 120 may calculate "R2-P" to calculate the second lower limit value L2.

Also, the control unit 120 may be configured to calculate the second upper limit value U2 by adding the parallel deviation to the second criterion resistance R2.

For example, the control unit 120 may calculate the second upper limit value U2 by adding the parallel deviation to the second criterion resistance R2. Specifically, in the embodiment of FIG. 3, the control unit 120 may calculate the second upper limit value U2 by adding the parallel deviation P according to Equation 6 to the second criterion resistance R2. That is, the control unit 120 may calculate "R2+P" to calculate the second upper limit value U2.

Finally, the control unit 120 may be configured to set the second resistance section based on the calculated second lower limit value L2 and the calculated second upper limit value U2.

For example, the control unit 120 may set the calculated second lower limit value L2 as the lower limit threshold value of the second resistance section, and set the calculated second upper limit value U2 as the upper limit threshold value of the second resistance section. That is, the control unit 120 may set the resistance section corresponding to "R2−P to R2+P" as the second resistance section.

The battery diagnosing apparatus 100 according to the present disclosure may be applied to a BMS (Battery Management System). That is, the BMS according to the present disclosure may include the battery diagnosing apparatus 100 described above. In this configuration, at least some components of the battery diagnosing apparatus 100 may be implemented by supplementing or adding functions of the configuration included in the conventional BMS. For example, the resistance measuring unit 110, the control unit 120 and the storage unit 130 may be implemented as components of the BMS.

In addition, the battery diagnosing apparatus 100 according to the present disclosure may be provided to a battery pack 1. That is, the battery pack 1 according to the present disclosure may include the above-described battery diagnosing apparatus 100 and at least one battery module B. In addition, the battery pack 1 may further include electrical equipment (a relay, a fuse, etc.) and a case.

Figure 4:
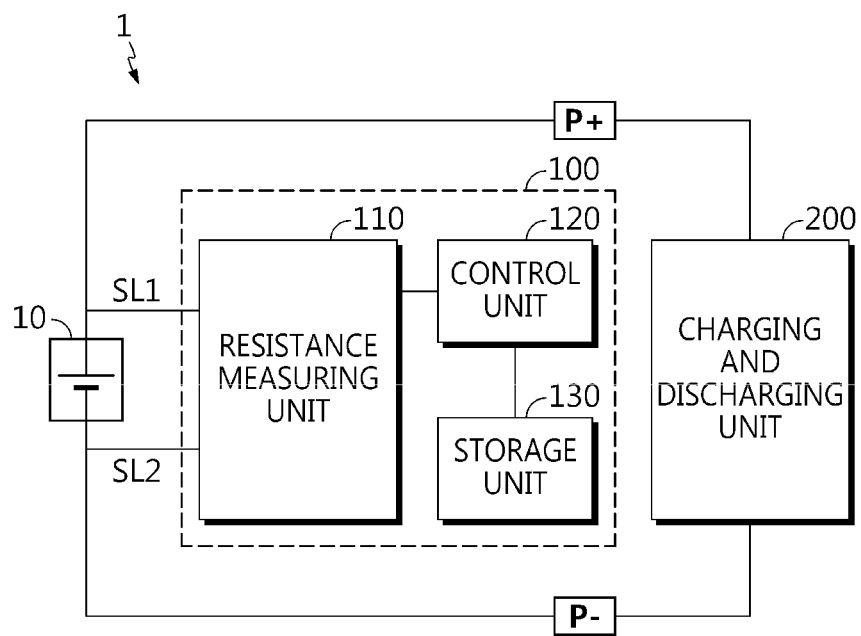
FIG. 4 is a diagram schematically showing an exemplary configuration of a battery pack according to another embodiment of the present disclosure.

FIG. 4 is a diagram schematically showing an exemplary configuration of a battery pack 1 according to another embodiment of the present disclosure.

Referring to FIG. 4, the battery pack 1 may include a battery 10 and a battery diagnosing apparatus 100. In addition, a charging and discharging unit 200 may be included in the battery pack 1 or may be provided outside the battery pack 1 and connected to a positive electrode terminal P+ and a negative electrode terminal P− of the battery pack 1.

In the embodiment of FIG. 4, the battery 10 may include a plurality of battery modules B. In addition, each battery module B may include a plurality of battery cells having the same connection structure. That is, the parallel coefficient (parallel coefficient (μ) according to Equation 5) for the plurality of battery modules B may be the same.

In the embodiment of FIG. 4, the resistance measuring unit 110 may measure the resistance of the battery 10 when charging of the battery 10 is started or the discharging is terminated by the charging and discharging unit 200. Specifically, the resistance measuring unit 110 may be connected to the battery 10 through a first sensing line SL1 and a second sensing line SL2. The resistance measuring unit 110 may measure the voltage of the battery 10 based on the voltage value measured at each of the first sensing line SL1 and the second sensing line SL2. In addition, the resistance measuring unit 110 may measure the internal resistance of the battery 10 based on Equation 1. Preferably, the resistance measuring unit 110 may measure the internal resistance of each of the plurality of battery modules B included in the battery 10.

In addition, the control unit 120 may diagnose the state of each of the plurality of battery modules B based on the resistance information for the plurality of battery modules B measured by the resistance measuring unit 110.

Figure 5:
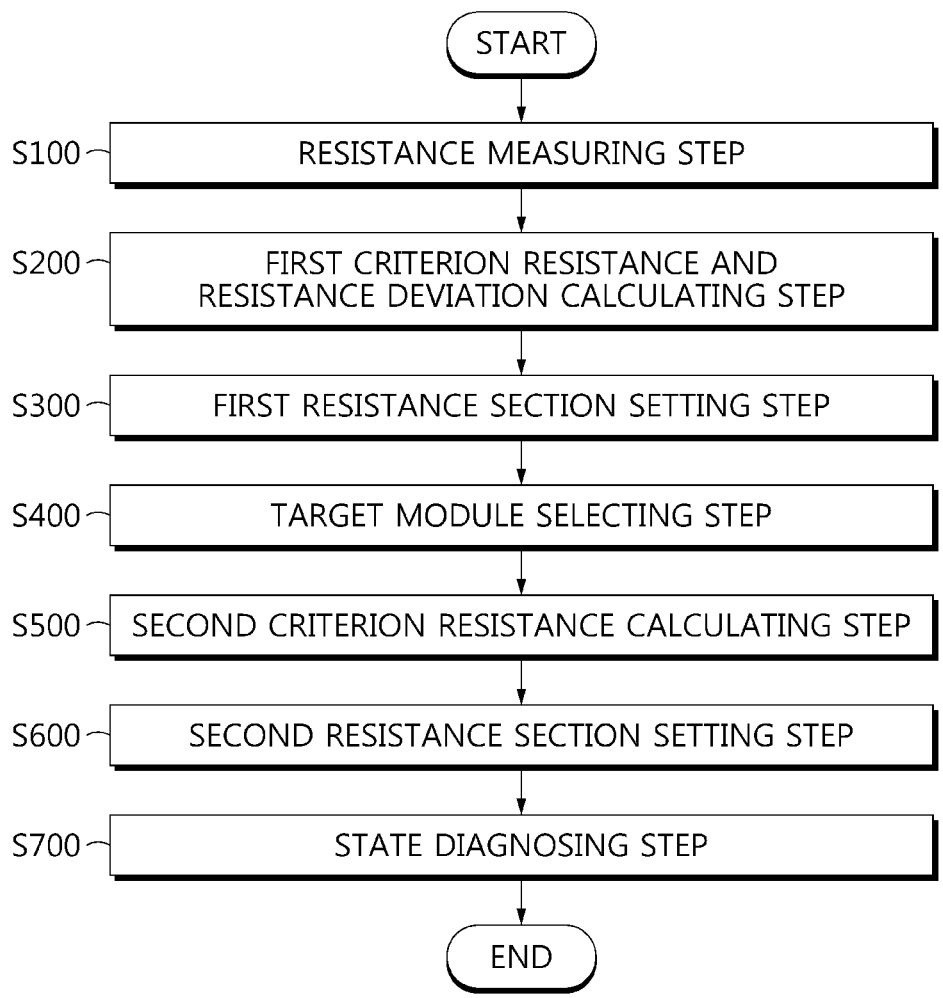
FIG. 5 is a diagram schematically showing a battery diagnosing method according to still another embodiment of the present disclosure.

FIG. 5 is a diagram schematically showing a battery diagnosing method according to still another embodiment of the present disclosure.

Hereinafter, for convenience of description, it should be noted that the content overlapping with the previously described content will be omitted or briefly described. Preferably, each step of the battery diagnosing method may be performed by the battery diagnosing apparatus 100. Referring to FIG. 5, the battery diagnosing method may include a resistance measuring step (S100), a first criterion resistance and resistance deviation calculating step (S200), a first resistance section setting step (S300), a target module T selecting step (S400), a second criterion resistance calculating step (S500), a second resistance section setting step (S600) and a state diagnosing step (S700).

The resistance measuring step (S100) is a step of measuring an internal resistance of each of a plurality of battery modules B including one or more battery cells, and may be performed by the resistance measuring unit 110.

For example, the resistance measuring unit 110 may measure the resistance of each of the plurality of battery modules B when the charging of the battery module B is started or the discharging is terminated. Preferably, the resistance measuring unit 110 may measure the voltage of each of the plurality of battery modules B at two different time points, and may measure the resistance of each of the plurality of battery modules B based on Equation 1.

The first criterion resistance and resistance deviation calculating step (S200) is a step of calculating a first criterion resistance R1 and a resistance deviation for the plurality of battery modules B based on the resistance information about the internal resistance of each of the plurality of battery modules B measured in the resistance measuring step (S100), and may be performed by the control unit 120.

For example, the control unit 120 may calculate a value representing the internal resistance of each of the plurality of battery modules B measured by the resistance measuring unit 110 as the first criterion resistance R1. Here, the control unit 120 may calculate an average value or a median value of the internal resistances of the plurality of battery modules B as the first criterion resistance R1.

In addition, the control unit 120 may calculate an absolute deviation D according to Equation 2, calculate a scale factor C according to Equation 3, and calculate a resistance deviation S according to Equation 5.

The first resistance section setting step (S300) is a step of setting a first resistance section based on the first criterion resistance R1 and the resistance deviation calculated in the first criterion resistance and resistance deviation calculating step (S200), and may be performed by the control unit 120.

For example, the control unit 120 may calculate a first upper limit value U1 by adding resistance deviation S to the first criterion resistance R1, and calculate a first lower limit value L1 by subtracting the resistance deviation S from the first criterion resistance R1. In addition, the control unit 120 may set a resistance section for the first lower limit value L1 to the first upper limit value U1 as the first resistance section.

The target module T selecting step (S400) is a step of selecting a part of the plurality of battery modules B as a target module T based on the resistance information, and may be performed by the control unit 120.

For example, the control unit 120 may select a battery module B having an internal resistance equal to or less than the first criterion resistance R1 among the plurality of battery modules B as the target module T.

The second criterion resistance calculating step (S500) is a step of calculating a second criterion resistance R2 for the target module T based on the resistance information, and may be performed by the control unit 120.

For example, the control unit 120 may calculate a value representing the internal resistance of each of the plurality of target modules T as the second criterion resistance R2. Here, the control unit 120 may calculate an average value or a median value of the internal resistances of the plurality of target modules T as the second criterion resistance R2.

Preferably, the control unit 120 may set the calculation condition for the first criterion resistance R1 and the calculation condition for the second criterion resistance R2 differently. For example, when the first criterion resistance R1 is calculated as a median value of the internal resistances of the plurality of battery modules B, the second criterion resistance R2 may be calculated as an average value of the internal resistances of the plurality of target modules T.

The second resistance section setting step (S600) is a step of setting a second resistance section based on the second criterion resistance R2 calculated in the second criterion resistance calculating step (S500) and the connection structure between the battery cells included in each of the plurality of battery modules B, and may be performed by the control unit 120.

For example, the control unit 120 may calculate a parallel coefficient (μ) according to Equation 5 in consideration of the connection structure of the plurality of battery cells included in the battery module B. In addition, the control unit 120 may calculate the parallel deviation P according to Equation 6.

The state diagnosing step (S700) is a step of diagnosing the state of each of the plurality of battery modules B based on the measured internal resistance, the first resistance section and the second resistance section, and may be performed by the control unit 120.

For example, the control unit 120 may diagnose the state of the battery module B of which the calculated internal resistance belongs to both the first resistance section and the second resistance section as a normal state among the plurality of battery modules B. Conversely, the control unit 120 may diagnose the state of the battery module B of which the calculated internal resistance does not belong to the first resistance section or the second resistance section as an abnormal state among the plurality of battery modules B.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery
100: battery diagnosing apparatus
110: resistance measuring unit
120: control unit
130: storage unit
200: charging and discharging unit

What is claimed is:

1. A battery diagnosing apparatus, comprising:
a resistance measuring unit configured to measure an internal resistance of each of a plurality of battery modules including one or more battery cells; and
a control unit configured to receive resistance information about the internal resistance of each of the plurality of battery modules from the resistance measuring unit,
calculate a first criterion resistance and an absolute deviation between the first criterion resistance and the internal resistance,
convert the calculated absolute deviation into a resistance deviation for the plurality of battery modules based on the resistance information,
set a first resistance section based on the calculated first criterion resistance and the calculated resistance deviation,
select a part of the plurality of battery modules as a target module based on the resistance information,
calculate a second criterion resistance for the target module based on the resistance information,
set a second resistance section based on the calculated second criterion resistance and a connection structure between the one or more battery cells included in each of the plurality of battery modules, and
diagnose a state of each of the plurality of battery modules based on the measured internal resistance, the first resistance section and the second resistance section.

2. The battery diagnosing apparatus according to claim 1,
wherein the control unit is configured to diagnose a state of a battery module of which the calculated internal resistance belongs to both the first resistance section and the second resistance section as a normal state among the plurality of battery modules, and
wherein the control unit is configured to diagnose a state of a battery module of which the calculated internal resistance does not belong to the first resistance section or the second resistance section as an abnormal state among the plurality of battery modules.

3. The battery diagnosing apparatus according to claim 1,
wherein the control unit is configured to calculate the first criterion resistance based on internal resistances of the plurality of battery modules, and calculate the resistance deviation based on a difference between the calculated first criterion resistance and the internal resistance of each of the plurality of battery modules.

4. The battery diagnosing apparatus according to claim 3,
wherein the control unit is configured to calculate a first lower limit value by subtracting the resistance deviation from the first criterion resistance, calculate a first upper limit value by adding the resistance deviation to the first criterion resistance, and set the first resistance section based on the calculated first lower limit value and the calculated first upper limit value.

5. The battery diagnosing apparatus according to claim 3,
wherein the control unit is configured to calculate the absolute deviation between the calculated first criterion resistance and the internal resistance of each of the plurality of battery modules, and convert the calculated absolute deviation into the resistance deviation by using a predetermined scale factor.

6. The battery diagnosing apparatus according to claim 5,
wherein the first criterion resistance is a median value for the internal resistances of the plurality of battery modules.

7. The battery diagnosing apparatus according to claim 1,
wherein the control unit is configured to select a battery module of which the calculated internal resistance is equal to or less than the first criterion resistance as the target module among the plurality of battery modules.

8. The battery diagnosing apparatus according to claim 1,
wherein the control unit is configured to calculate a parallel deviation based on a number of parallel connections of the one or more battery cells included in each of the plurality of battery modules, and set the second resistance section according to the second criterion resistance and the calculated parallel deviation.

9. The battery diagnosing apparatus according to claim 8,
wherein the control unit is configured to calculate a second lower limit value by subtracting the parallel deviation from the second criterion resistance, calculate a second upper limit value by adding the parallel deviation to the second criterion resistance, and set the second resistance section based on the calculated second lower limit value and the calculated second upper limit value.

10. The battery diagnosing apparatus according to claim 8,
wherein the control unit is configured to calculate a parallel coefficient for the plurality of battery modules based on the number of parallel connections, and calculate the parallel deviation by multiplying the calculated parallel coefficient by the second criterion resistance.

11. The battery diagnosing apparatus according to claim 10,
wherein the second criterion resistance is an average value for an internal resistance of the target module.

12. A battery pack, comprising the battery diagnosing apparatus according to claim 1.

13. The battery diagnosing apparatus according to claim 1, further comprising:
a charging and discharging unit,
wherein the resistance measuring unit is configured to measure the internal resistance of each battery when charging of each battery is started or discharging of each battery is terminated by the charging and discharging unit.

14. A battery diagnosing method, comprising:
measuring, by a resistance measuring unit, an internal resistance of each of a plurality of battery modules including one or more battery cells, in a resistance measuring operation;
calculating, by a control unit, a first criterion resistance and an absolute deviation between the first criterion resistance and the internal resistance, and converting the calculated absolute deviation into a resistance deviation for the plurality of battery modules based on resistance information about the internal resistance of each of the plurality of battery modules measured in the resistance measuring operation, in a first criterion resistance and resistance deviation calculation operation;

a first resistance section setting operation of setting a first resistance section based on the first criterion resistance and the resistance deviation calculated in the first criterion resistance and resistance deviation calculating operation;

a target module selecting operation of selecting a part of the plurality of battery modules as a target module based on the resistance information;

a second criterion resistance calculating operation of calculating a second criterion resistance for the target module based on the resistance information;

a second resistance section setting operation of setting a second resistance section based on the second criterion resistance calculated in the second criterion resistance calculating operation and a connection structure between the one or more battery cells included in each of the plurality of battery modules; and a state diagnosing operation of diagnosing a state of each of the plurality of battery modules based on the measured internal resistance, the first resistance section and the second resistance section.

15. The method according to claim 14, further comprising:

diagnosing a state of a battery module among the plurality of battery modules as a normal state when the calculated internal resistance of the battery module belongs to both the first resistance section and the second resistance section, and diagnosing a state of a battery module among the plurality of battery modules as an abnormal state when the calculated internal resistance of the battery module does not belong to the first resistance section or the second resistance section.

16. The method according to claim 14, further comprising, measuring, by the resistance measuring unit, the internal resistance of each battery when charging of each battery is started or when discharging of each battery is terminated by a charging and discharging unit.

17. The method according to claim 14, further comprising calculating the first criterion resistance based on internal resistances of the plurality of battery modules, and calculating the resistance deviation based on a difference between the calculated first criterion resistance and the internal resistance of each of the plurality of battery modules.

18. The method according to claim 17, further comprising calculating a first lower limit value by subtracting the resistance deviation from the first criterion resistance, calculating a first upper limit value by adding the resistance deviation to the first criterion resistance, and setting the first resistance section based on the calculated first lower limit value and the calculated first upper limit value.

19. The method according to claim 14, wherein the first criterion resistance is a median value for the internal resistances of the plurality of battery modules.

20. The method according to claim 14, further comprising selecting a battery module of which the calculated internal resistance is equal to or less than the first criterion resistance as the target module among the plurality of battery modules.

* * * * *